(12) United States Patent
Cheng et al.

(10) Patent No.: US 7,964,487 B2
(45) Date of Patent: Jun. 21, 2011

(54) CARRIER MOBILITY ENHANCED CHANNEL DEVICES AND METHOD OF MANUFACTURE

(75) Inventors: Kangguo Cheng, Guilderland, NY (US); Haining S Yang, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 125 days.

(21) Appl. No.: 12/132,887

(22) Filed: Jun. 4, 2008

(65) Prior Publication Data

US 2009/0302412 A1 Dec. 10, 2009

(51) Int. Cl.
*H01L 21/28* (2006.01)
*H01L 21/336* (2006.01)

(52) U.S. Cl. ........ 438/585; 438/589; 438/926; 438/299; 257/E21.444

(58) Field of Classification Search .................. 438/585, 438/589, 926; 257/E21.444
See application file for complete search history.

(56) References Cited

U.S. PATENT DOCUMENTS

| | | | | |
|---|---|---|---|---|
| 6,087,231 A * | 7/2000 | Xiang et al. | ................... | 438/287 |
| 6,171,910 B1 * | 1/2001 | Hobbs et al. | ................... | 438/275 |
| 6,225,173 B1 | 5/2001 | Yu | | |
| 6,278,164 B1 | 8/2001 | Hieda et al. | | |
| 6,278,165 B1 * | 8/2001 | Oowaki et al. | ................ | 257/410 |
| 6,423,619 B1 * | 7/2002 | Grant et al. | ................... | 438/589 |
| 6,642,563 B2 * | 11/2003 | Kanaya | ........................ | 257/296 |
| 6,664,592 B2 | 12/2003 | Inumiya et al. | | |
| 6,852,559 B2 * | 2/2005 | Kwak et al. | ...................... | 438/44 |
| 6,908,801 B2 * | 6/2005 | Saito | .............................. | 438/199 |
| 6,943,087 B1 * | 9/2005 | Xiang et al. | .................. | 438/311 |
| 7,033,869 B1 * | 4/2006 | Xiang et al. | .................. | 438/149 |
| 7,074,623 B2 | 7/2006 | Lochtefeld et al. | | |
| 7,138,649 B2 | 11/2006 | Currie et al. | | |
| 7,265,428 B2 * | 9/2007 | Aoyama | ....................... | 257/413 |
| 7,301,180 B2 | 11/2007 | Lee et al. | | |
| 7,435,636 B1 * | 10/2008 | Hanafi | .......................... | 438/183 |
| 7,569,442 B2 * | 8/2009 | Ouyang et al. | ................ | 438/172 |
| 7,602,013 B2 * | 10/2009 | Miyano et al. | ................ | 257/328 |
| 7,671,394 B2 * | 3/2010 | Booth et al. | .................... | 257/301 |
| 2003/0065809 A1 * | 4/2003 | Byron | .......................... | 709/232 |
| 2007/0032009 A1 | 2/2007 | Currie et al. | | |
| 2008/0030254 A1 | 2/2008 | Arsovski et al. | | |

(Continued)

FOREIGN PATENT DOCUMENTS

EP 0-397-987 3/1990

(Continued)

OTHER PUBLICATIONS

PCT/US/ 09/45788, International Search Report and Written Opinion of the International Searching Authority, issued Jul. 21, 2009.

*Primary Examiner* — Mary Wilczewski
(74) *Attorney, Agent, or Firm* — Joseph Petrokaitis; Roberts Mlotkowski Safran & Cole, P.C.

(57) ABSTRACT

An integrated circuit with stress enhanced channels, a design structure and a method of manufacturing the integrated circuit is provided. The method includes forming a dummy gate structure on a substrate and forming a trench in the dummy gate structure. The method further includes filling a portion of the trench with a strain inducing material and filling a remaining portion of the trench with gate material.

25 Claims, 10 Drawing Sheets

U.S. PATENT DOCUMENTS

| | | | | |
|---|---|---|---|---|
| 2008/0054365 A1* | 3/2008 | Aoyama | | 257/369 |
| 2008/0061369 A1* | 3/2008 | Shimizu et al. | | 257/347 |
| 2008/0061370 A1* | 3/2008 | Matsuo | | 257/347 |
| 2008/0079084 A1* | 4/2008 | Hanafi | | 257/369 |
| 2009/0011563 A1* | 1/2009 | Hanafi | | 438/285 |
| 2009/0221447 A1* | 9/2009 | Mur et al. | | 506/17 |
| 2009/0242936 A1* | 10/2009 | Cheng et al. | | 257/190 |
| 2009/0302412 A1* | 12/2009 | Cheng et al. | | 257/506 |
| 2010/0001323 A1* | 1/2010 | Tateshita | | 257/288 |
| 2010/0038705 A1* | 2/2010 | Doris et al. | | 257/327 |
| 2010/0044783 A1* | 2/2010 | Chuang et al. | | 257/328 |
| 2010/0048010 A1* | 2/2010 | Chen et al. | | 438/591 |
| 2010/0055923 A1* | 3/2010 | Chang | | 438/745 |

FOREIGN PATENT DOCUMENTS

JP        2001-093987        4/2001

* cited by examiner

CARRIER MOBILITY ENHANCED CHANNEL DEVICES AND METHOD OF MANUFACTURE

FIELD OF THE INVENTION

The present invention relates to integrated circuits (ICs), a design structure and a method of manufacturing and, more particularly, to an integrated circuit with carrier mobility enhanced channels, a design structure and a method of manufacturing the integrated circuit.

BACKGROUND

CMOS technology embodied as a high performance, low-power chip, has been widely used in electronic devices because of its scaleable. However, continuing this CMOS performance trend has become extremely difficult because the industry is approaching the fundamental physical limits of CMOS scaling. For this reason, the semiconductor industry has been aggressively seeking new ways to make electric charges move faster through device channels so as to increase circuit speeds and reduce power consumption.

It has been found that a way to improve CMOS performance is to increase the mobility of its positive charges, or holes, through the device channels. For PFETs, hole mobility is known to be 2.5 times higher on (110) surface-orientation compared to that on standard wafer with (100) surface-orientation. To increase hole and electron mobility, the industry has tried to incorporate Ge materials into the semiconductor processing methodologies; however, the presence of Ge causes material and process integration challenges to the semiconductor manufacturer.

More specifically, Ge has been used as a channel material to enhance electron and hole mobility for both NFET and PFET devices. However, due to the low melting point of Ge (e.g., about 938° C.), it has a tendency to fluidize during normal annealing processes, which take place at about 1000° C. This, in turn, affects the properties and characteristics of Ge and hence the device. Also, it is difficult to form an oxide on Ge, compared to Si. Moreover, the dopant diffusion of Ge is very fast and, as such, it becomes very difficult to control the dopant profiles in the source and drain regions, as well as in the halo regions. For these and other reasons, Ge has not been integrated to standard silicon technology.

Accordingly, there exists a need in the art to overcome the deficiencies and limitations described hereinabove.

SUMMARY

In a first aspect of the invention, a method comprises forming a dummy gate structure on a substrate and forming a trench in the dummy gate structure. The method further comprises filling a portion of the trench with a high carrier mobility material and filling a remaining portion of the trench with gate material.

In another aspect of the invention, a method of forming a device comprises building a dummy gate structure on a substrate and etching at least a portion of the dummy gate structure to a channel region. This latter step results in a formation of a trench between sidewalls of the dummy gate structure. The method further comprises depositing a high carrier mobility material on the substrate within the trench and building a gate structure over the strain inducing material.

In a further aspect of the invention, a structure comprises a germanium material formed directly on a substrate and at least within a trench defined by sidewalls of a dummy gate structure.

In yet a still further aspect of the invention, a design structure is embodied in a machine-readable medium for designing, manufacturing, or testing an integrated circuit. The design structure comprises a germanium material formed directly on a substrate and at least within a trench defined by sidewalls of a dummy gate structure. The design structure further comprises a dielectric material that lines inner portions of the sidewalls, and a metal or metal alloy that contacts with the dielectric material.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The present invention relates to integrated circuits, a design structure and a method of manufacturing an integrated circuit and, more particularly, to an integrated circuit with a stress enhanced channel, a design structure and a method of manufacturing the integrated circuit. In implementation, the present invention provides a process to integrate Ge into a channel region of the device using a conventional flow to form both an NFET and PFET device, simultaneously. Advantageously, the present invention does not suffer from the drawbacks of known integration methods and provides enhanced device performance. The devices manufactured using the processes of the present invention will benefit from strained Si mobility enhancement.

First Aspect of the Invention

Figure 1:
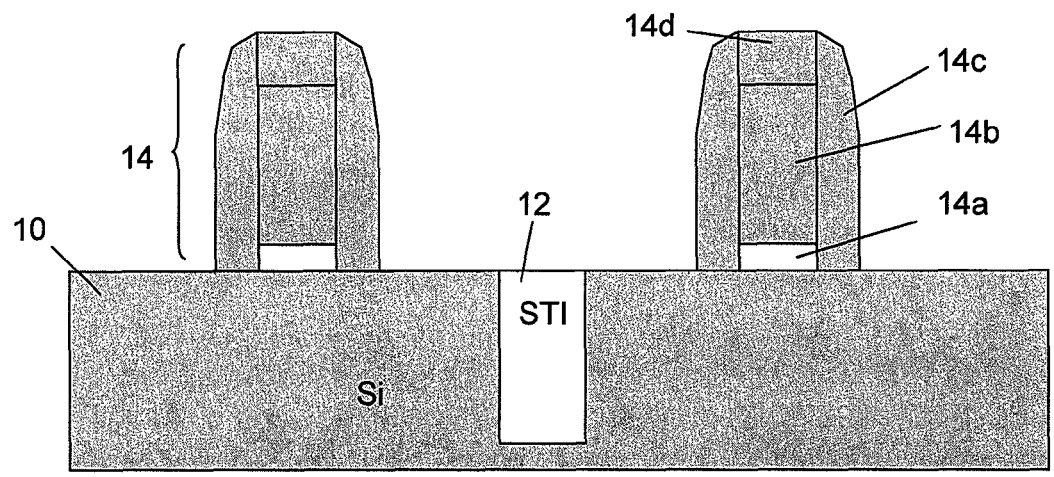
FIGS. 1-8 show intermediate structures and respective processing steps in accordance with a first aspect of the invention.

FIGS. 1-8 show intermediate structures and respective processing steps in accordance with a first aspect of the invention. In particular, FIG. 1 shows a starting structure in accordance with the invention. In this starting structure, a dummy gate structure 14 is formed on a substrate 10 using conventional deposition, lithographic and etching processes and as such an explanation of the manufacturing processes is not required herein for one of skill in the art to understand the invention. The dummy gate structure 14 includes a polysilicon layer 14b formed on a thin oxide layer 14a (e.g., about 10 Å to 20 Å). Sidewalls 14c are formed on the side of the polysilicon layer 14b and thin oxide layer 14a, which may comprise nitride or oxide or a combination thereof. A nitride cap 14d is formed on the gate structure and more particularly on the polysilicon layer. For purposes of discussion, the polysilicon layer 14b and oxide layer 14a may be defined as a body portion of the gate, in addition to, in embodiments, the capping layer.

A shallow trench isolation (STI) structure 12 is formed between the dummy gates 14. In embodiments, the STI structure 12 can be formed using a conventional lithographic and etching process. The STI structure 12 is filled with an oxide material.

Figure 2:
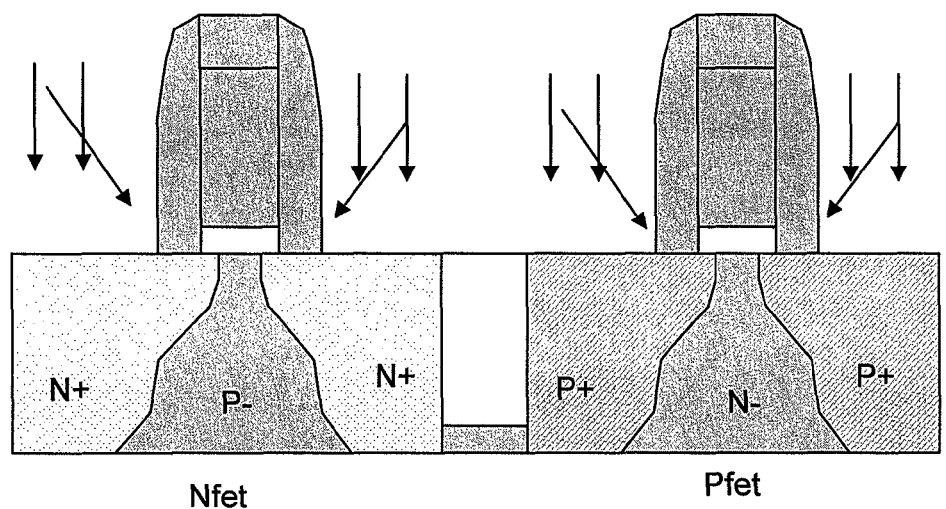

In FIG. 2, NFET and PFET devices are formed using conventional doping processes. For example, in an NFET device, a lightly doped P− region is formed under the gate structure 14. The lightly doped P− region may be formed using a low concentration of boron in the range of, for example, 1E17 to 1E19/cm$^3$. The N+ regions of the NFET device can be formed by heavily doping these regions with Arsenic or Phosphorous or a combination thereof. The concentration of such dopants may be in the range of, for example, 1E20 to 5E21/cm$^3$.

FIG. 2 also shows the formation of the PFET. For the PFET device, a lightly doped N− region is formed under the gate structure 14. The lightly doped N− region may be formed using a low concentration of Arsenic or Phosphorous or a combination thereof in the range of, for example, 1E17 to 1E19/cm$^3$. The P+ regions of the PFET device can be formed by heavily doping these regions with Boron. The concentration of Boron may be in the range of, for example, 1E20 to 5E21/cm$^3$.

Figure 3:
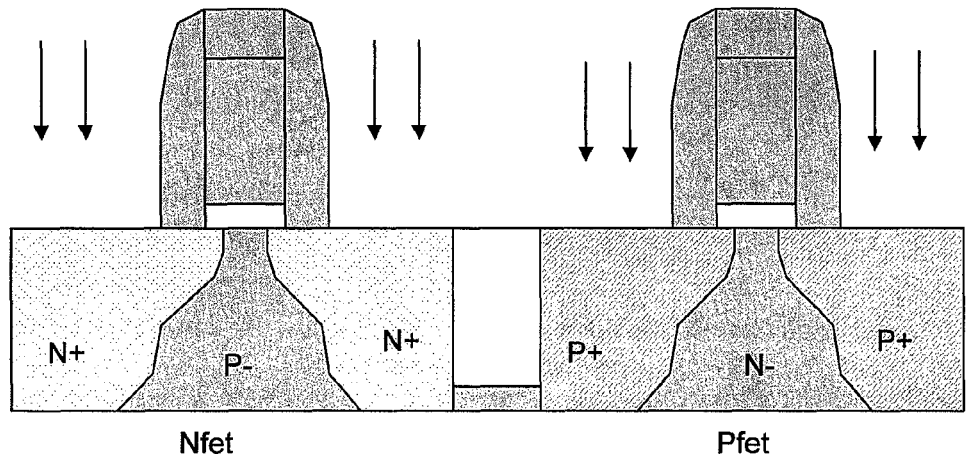

FIG. 3 shows a dopant activation anneal process. In this processing step, the structure of FIG. 2 undergoes an anneal process at a temperature of about 1000° C. This anneal process can range from a few seconds to a flash annealing process. The anneal may also be a laser anneal.

Figure 4:
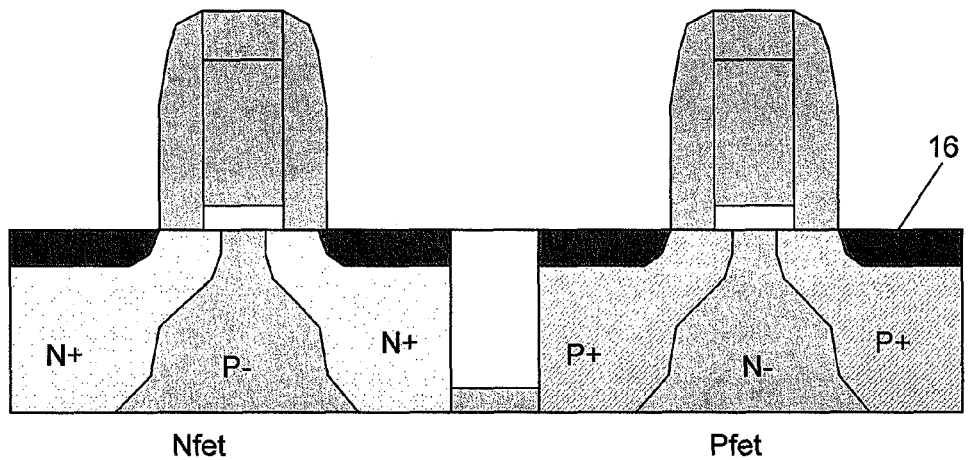

In FIG. 4, the structure of FIG. 3 undergoes a Salicide formation. In this process, cobalt, nickel or nickel platinum, or other alloys, for example, can be deposited and annealed at a temperature of about 300° C. to about 700° C. In embodiments, this results in metal contact regions 16 formed of a metal silicide. In embodiments, the structure will undergo a wet etching process to remove any excess metal, e.g., non-reactive metal.

Figure 5:
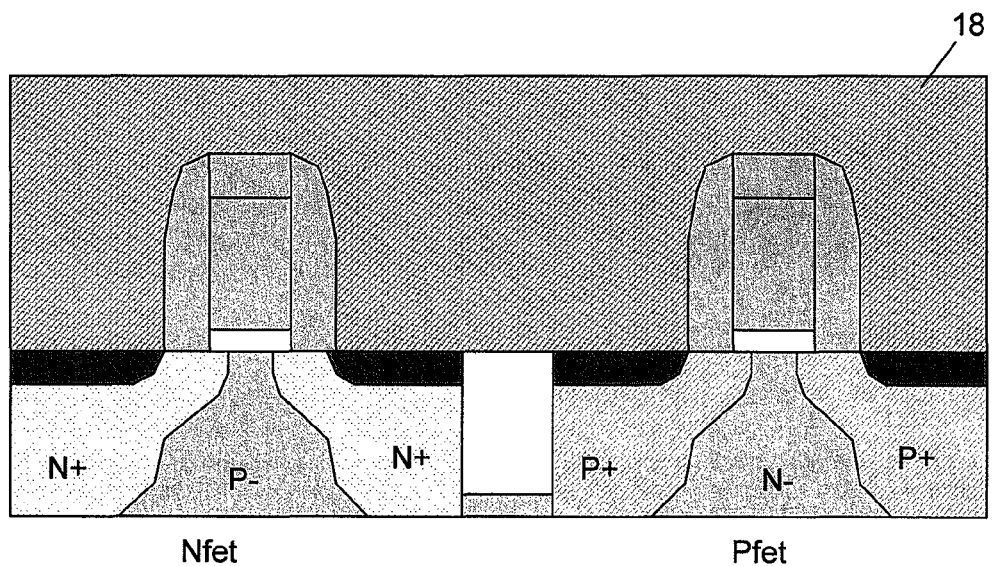

In FIG. 5, an interlevel dielectric 18 is deposited on the structure of FIG. 4. In embodiments, the interlevel dielectric 18 is deposited using a conventional chemical vapor deposition (CVD) process. The interlevel dielectric 18 may be an oxide-based material or low-K material.

Figure 6:
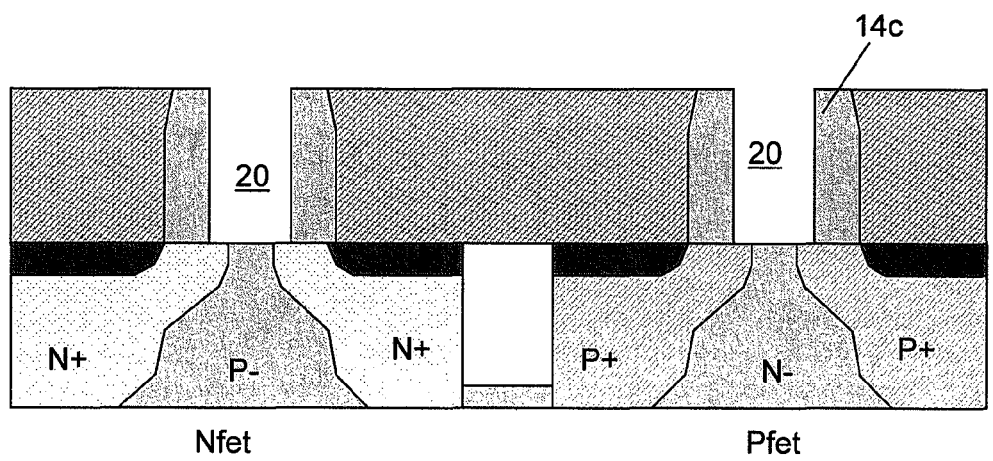

FIG. 6 shows a gate removal process. In particular, an upper layer of the interlevel dielectric 18 and the nitride cap is removed using, for example, a CMP process. In embodiments, the nitride cap can also be etched using a reactive ion etching (RIE). In further processing steps, the polysilicon layer of the gate structure 14 is removed using a wet etch process selective to polysilicon. A dilute HF etch is then used to remove the thin oxide layer of the gate structure 14. These processes form trenches 20 which expose the channel region (Si layer) between the sidewall structures 14c of the gate structure 14.

Figure 7:
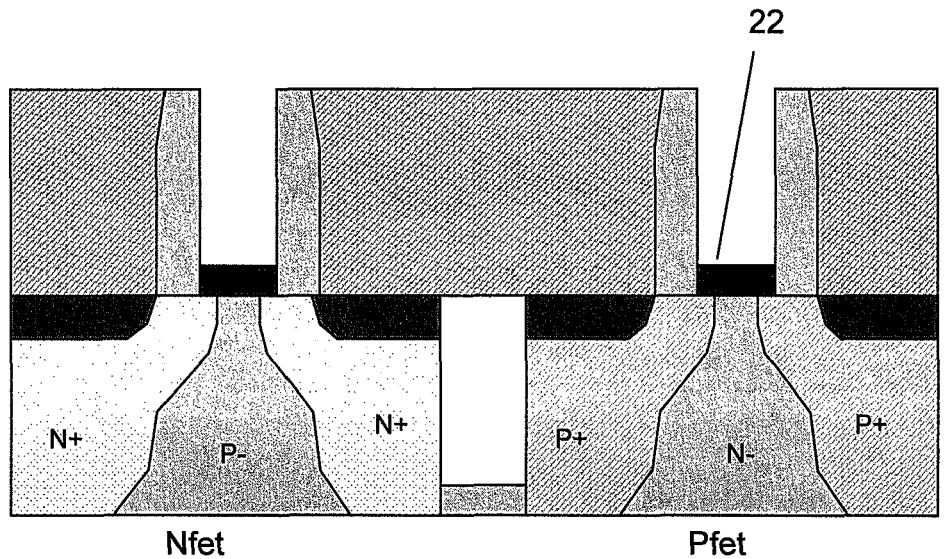

In FIG. 7, a high carrier mobility material such as germanium (Ge) 22 is deposited in the trenches 20, e.g., channel region, using conventional deposition processes. The Ge can be grown using epitaxial CVD or ALD process. In embodiments, the Ge 22 is deposited in the channel region directly on (contacting) the substrate 10 to a thickness ranging from about 1 nm to 10 nm and preferably 5 nm to 10 nm. This thickness range of the Ge material 22 ensures that there is no decoupling of the device.

Figure 8:
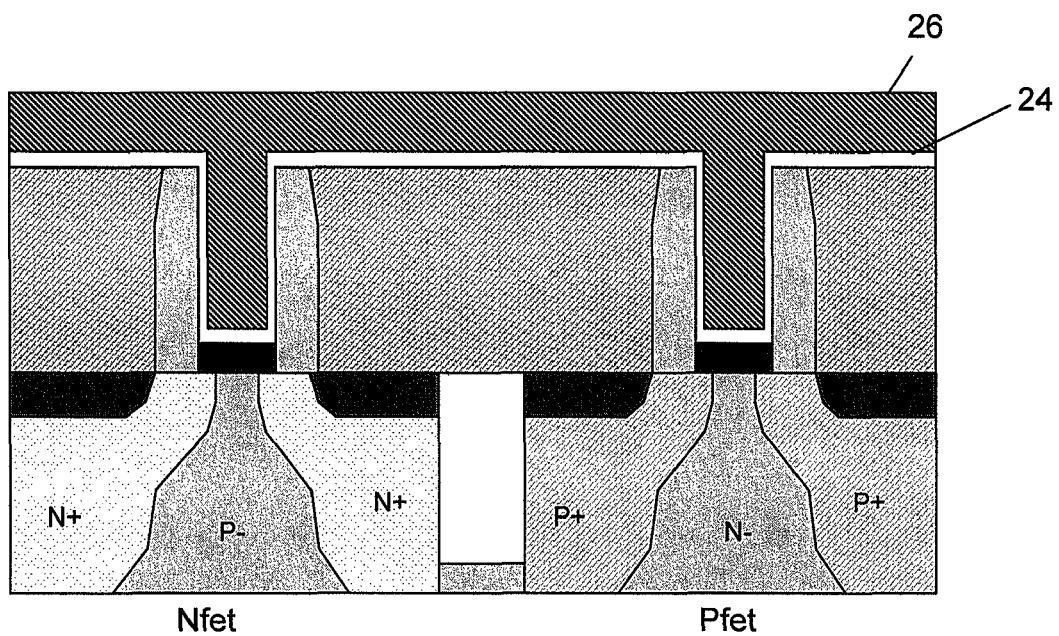

In FIG. 8, a high K dielectric material 24 is blanket deposited on the structure of FIG. 7, including over the Ge material 22 and sidewalls of the trenches. In embodiments, the high K dielectric material 24 is about 1 nm to 3 nm in thickness. A metal gate layer 26 is deposited on the high K dielectric material 24. The metal gate layer 26 may be, for example, TiN, TaN, WN, other known metal gates or any combination thereof. The metal gate layer 26 may also be a layered metal combination. In further embodiments, a metal poly gate combination can be used with the invention, with the metal contacting to the Ge material 22.

Figure 9:
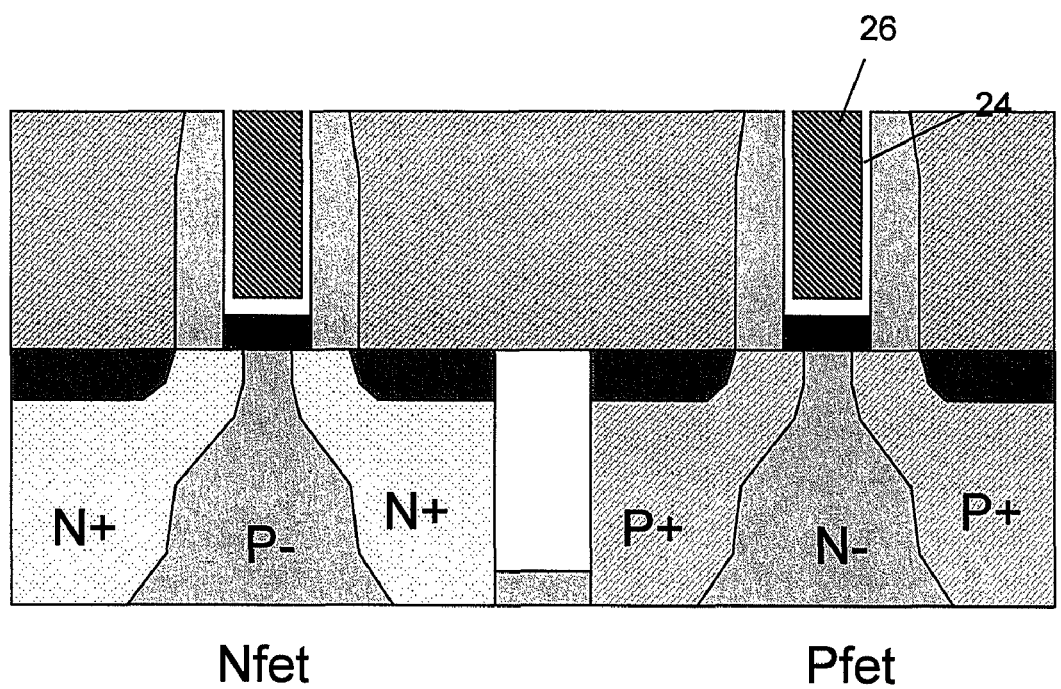
FIG. 9 shows a final structure and respective processing steps according to the first aspect of the invention.

FIG. 9 shows final processing steps and a final structure in accordance with a first aspect of the invention. In FIG. 9, the structure of FIG. 8 is planarized using, for example, a conventional CMP process.

Second Aspect of the Invention

Figure 10:
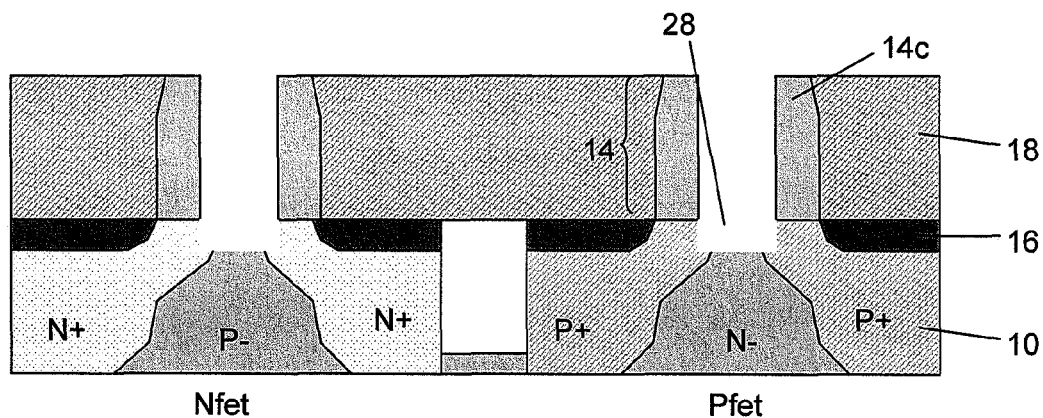
FIGS. 10 and 11 show intermediate structures and respective processing steps in accordance with a second aspect of the invention.
Figure 11:
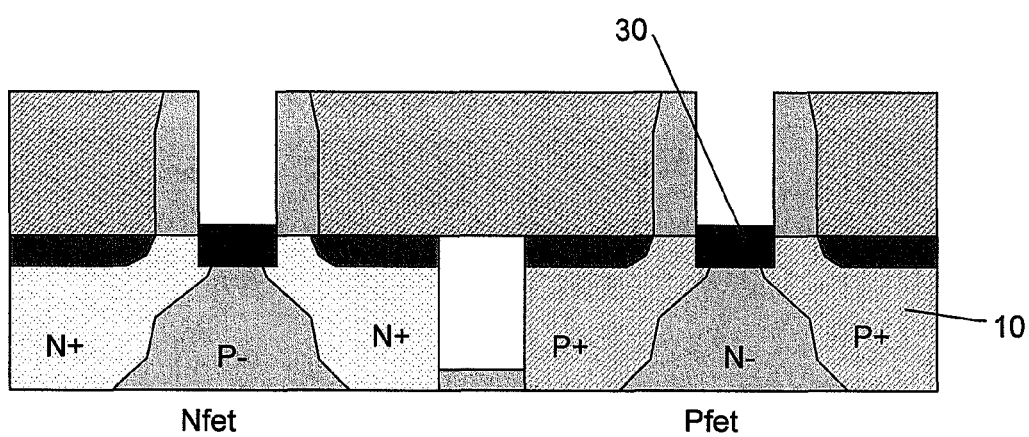

FIGS. 10 and 11 show intermediate structures and respective processing steps in accordance with a second aspect of the invention. In particular, FIG. 10 shows an intermediate structure similar to that shown in FIG. 6, with the addition of a recess 28 formed in the channel region of the substrate 10. By way of example, using conventional deposition, lithographic and etching processes a dummy gate structure 14 is formed on the substrate which includes a polysilicon layer formed on a thin oxide layer (e.g., about 10 Å to 20 Å). Sidewalls 14c are formed on the side of the polysilicon layer and thin oxide layer, which may comprise nitride or oxide or a combination thereof. A nitride cap is formed on the dummy gate structure 14 and more particularly on the polysilicon layer. A shallow trench isolation (STI) structure 12 is formed between the dummy gate structures.

Similarly to that described above, NFET and PFET devices are formed using conventional processes, including a dopant activation anneal process. The structure also undergoes a Salicide formation to form metal contact regions 16. An interlevel dielectric 18 is deposited on the structure using, for example, a conventional chemical vapor deposition (CVD) process. The interlevel dielectric 18 may be an oxide-based material or low-K material. In further processing steps, the nitride cap and the upper layer of the interlevel dielectric 18 is removed using, for example, a CMP process. In embodiments, the nitride cap can also be etched using a reactive ion etching (RIE). In further processing steps, the polysilicon layer of the gate structure is removed using a wet etch process selective to polysilicon. An HF etch is used to remove the thin oxide layer of the dummy gate structure 14.

Particular to the second aspect of the invention, a recess 28 (e.g., extension of the trench) is formed in the substrate 10 using a RIE or wet etch process, selective to the substrate 10. The recess 28 is about 1 nm to 10 nm in depth, and preferably about 5 nm to 10 nm in depth.

In FIG. 11, a strain inducing material such as Ge material 30 is deposited in the recess 28 (in the channel region directly on the substrate 10). In embodiments, the Ge material can be co-planar with the surface of the substrate 10, or above or below the surface of the substrate 10. Ge thickness can be in the range between 5 nm and 30 nm.

Figure 12:
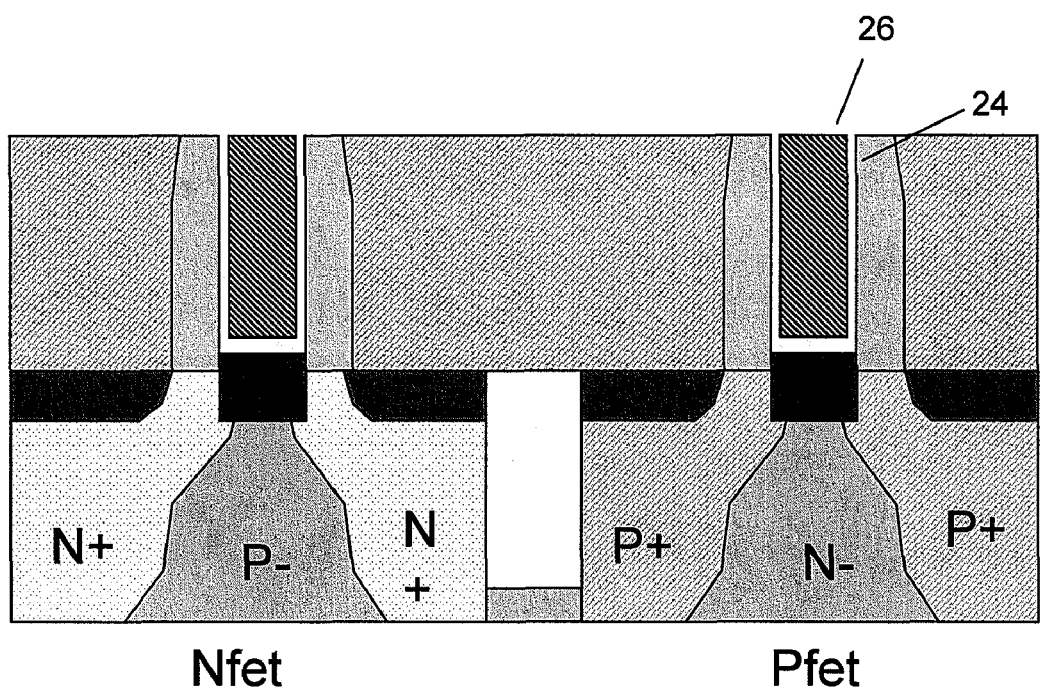
FIG. 12 shows a final structure and respective processing steps in accordance with the second aspect of the invention.

FIG. 12 shows a final structure in accordance with the invention and respective processing steps. Similar to that discussed above, a high K dielectric material 24 is blanket deposited on the structure of FIG. 11, including over the Ge material 30. In embodiments, the high K dielectric material 24 is about 1 nm to 3 nm in thickness. A metal gate layer 26 is deposited on the high K dielectric material 24. The metal gate layer 26 may be, for example, TiN, TaN, WN, other known metal gates or any combination thereof. The metal gate layer 26 may also be a layered metal combination. In further embodiments, a metal poly gate combination can be used with the invention, with the metal connecting the Ge material 30. The structure is planarized using, for example, a conventional CMP process.

Third Aspect of the Invention

Figure 13:
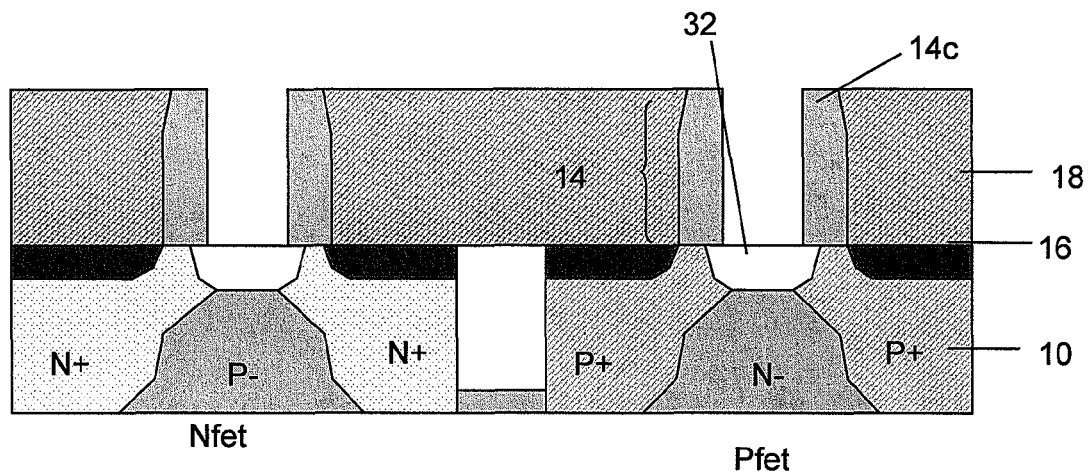
FIGS. 13 and 14 show intermediate structures and respective processing steps in accordance with a third aspect of the invention.
Figure 14:
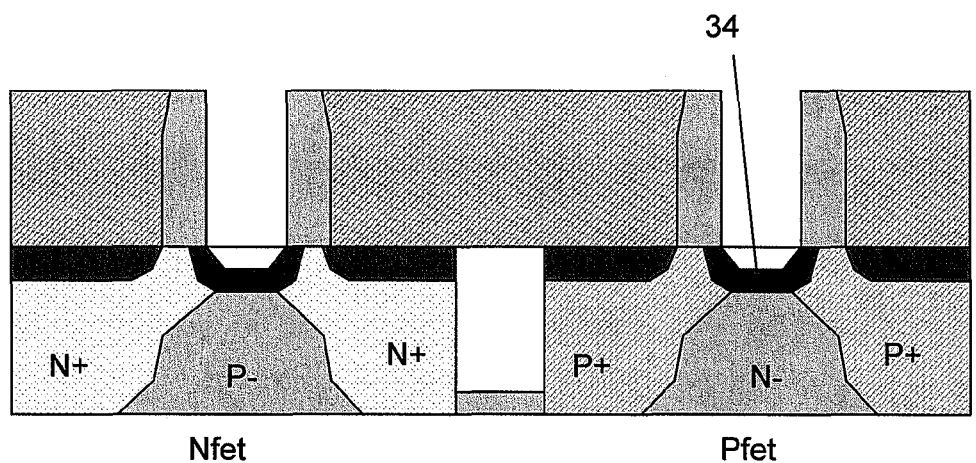

FIGS. 13 and 14 show intermediate structures and respective processing steps in accordance with a third aspect of the invention. In particular, FIG. 13 shows an intermediate structure similar to that shown in FIG. 6, with the addition of a recess 32 formed in the channel region of the substrate 10 and under portions of the sidewall structures 14c.

By way of example, using conventional deposition, lithographic and etching processes a dummy gate structure 14 is formed on the substrate which includes a polysilicon layer formed on a thin oxide layer (e.g., about 10 Å to 20 Å). Sidewalls 14c (shown in FIG. 10) are formed on the side of the polysilicon layer and thin oxide layer, which may comprise nitride or oxide or a combination thereof. A nitride cap is formed on the dummy gate structure 14 and more particularly on the polysilicon layer. A shallow trench isolation (STI) structure 12 is formed between the dummy gate structures.

Similarly to that described above, NFET and PFET devices are formed using conventional processes, including a dopant activation anneal process. The structure also undergoes a Salicide formation to form metal contact regions 16. An interlevel dielectric 18 is deposited on the structure using, for example, a conventional chemical vapor deposition (CVD) process. The interlevel dielectric 18 may be an oxide-based material or low-K material. In further processing steps, an upper layer of the interlevel dielectric 18 and the nitride cap is removed using, for example, a CMP process. In embodiments, the nitride cap can also be etched using a reactive ion etching (RIE). In further processing steps, the polysilicon layer of the gate structure is removed using a wet etch process selective to polysilicon. An HF etch is used to remove the thin oxide layer of the gate structure.

Particular to the third aspect of the invention, a recess 32 (e.g., extension of the trench) is formed in the substrate 10 using an isotropic etching process, selective to the substrate 10. The recess 32 is about 1 nm to 10 nm in depth, and preferably about 5 nm to 10 nm in depth, and extends to underneath the sidewalls 14c.

In FIG. 14, a strain inducting material such as Ge material 34 is deposited in the recess 32 (in the channel region directly on the substrate 10), including under the sidewalls 14c. In embodiments, the Ge material 34 is preferably lower than the surface of the substrate 10. This provides better control to the channel, as the channel is "wrapped" around the gate. In alternative embodiments, the Ge material 34 can be above or below the surface of the substrate 10. The Ge thickness is between 5 nm and 30 nm.

Figure 15:
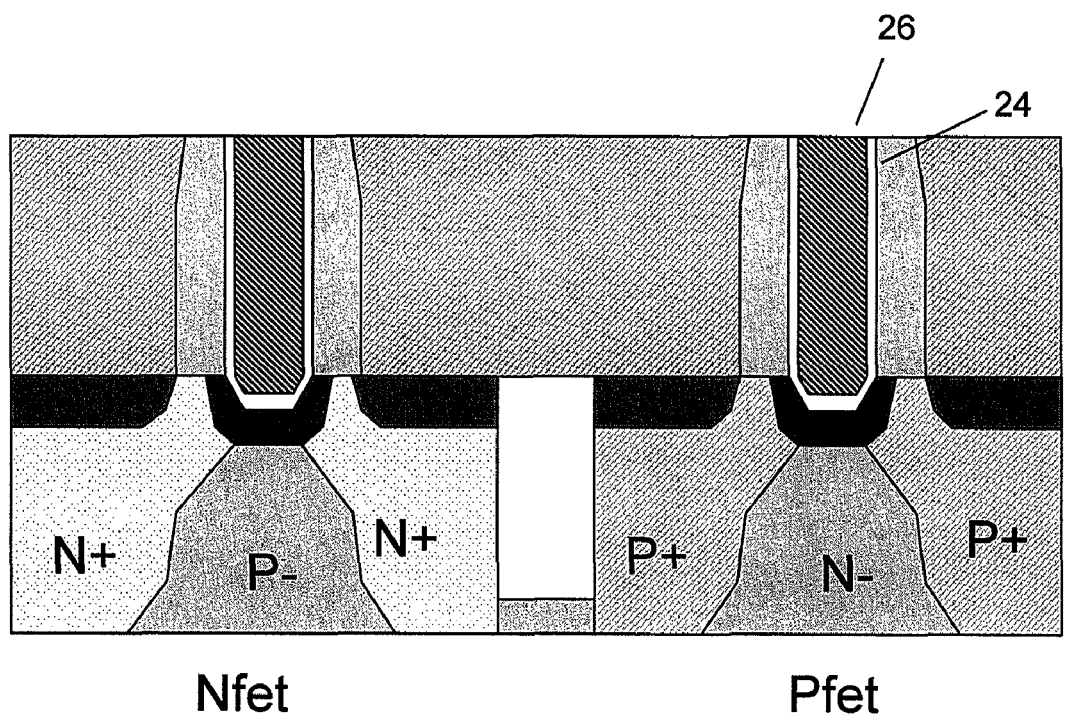
FIG. 15 shows a final structure and respective processing steps in accordance with the third aspect of the invention.

FIG. 15 shows a final structure in accordance with the invention and respective processing steps. Similar to that discussed above, a high K dielectric material 24 is blanket deposited on the structure of FIG. 14, including over the Ge material 34. In embodiments, the high K dielectric material 24 is about 1 nm to 3 nm in thickness. The metal gate layer 26 may be, for example, TiN, TaN, WN, other known metal gates or any combination thereof. The metal gate layer 26 may also be a layered metal combination. In further embodiments, a metal poly gate combination can be used with the invention, with the metal connecting the Ge material 34. The structure is planarized using, for example, a conventional CMP process.

The resulting integrated circuit chips of each aspect of the invention can be distributed by the fabricator in raw wafer form (that is, as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Design Structure

Figure 16:
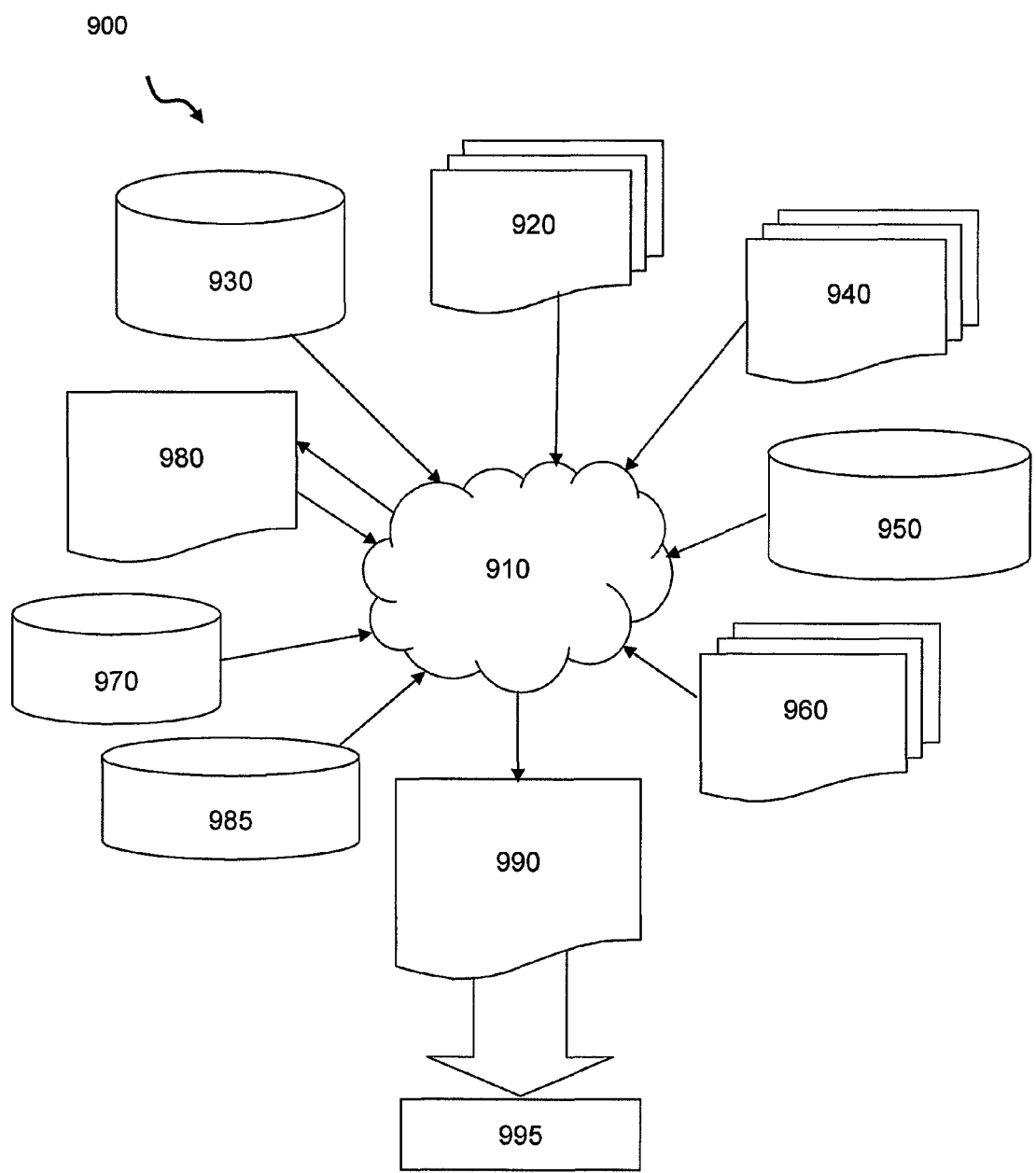
FIG. 16 is a flow diagram of a design process used in semiconductor design, manufacture, and/or test.

FIG. 16 shows a block diagram of an exemplary design flow 900 used for example, in semiconductor design, manufacturing, and/or test. Design flow 900 may vary depending on the type of IC being designed. For example, a design flow 900 for building an application specific IC (ASIC) may differ from a design flow 900 for designing a standard component. Design structure 920 is preferably an input to a design process 910 and may come from an IP provider, a core developer, or other design company or may be generated by the operator of the design flow, or from other sources. Design structure 920 comprises an embodiment of the invention as shown in FIGS. 9, 12 and 15 in the form of schematics or HDL, a hardware-description language (e.g., Verilog, VHDL, C, etc.).

Design structure 920 may be contained on one or more machine-readable medium. For example, design structure 920 may be a text file or a graphical representation of an embodiment of the invention as shown in FIGS. 9, 12 and 15. Design process 910 preferably synthesizes (or translates) an embodiment of the invention as shown in FIGS. 9, 12 and 15 into a netlist 980, where netlist 980 is, for example, a list of wires, transistors, logic gates, control circuits, I/O, models, etc. that describes the connections to other elements and circuits in an integrated circuit design and recorded on at least one of machine readable medium. This may be an iterative process in which netlist 980 is resynthesized one or more times depending on design specifications and parameters for the circuit.

Design process 910 may include using a variety of inputs; for example, inputs from library elements 930 which may house a set of commonly used elements, circuits, and devices, including models, layouts, and symbolic representations, for a given manufacturing technology (e.g., different technology nodes, 32 nm, 45 nm, 90 nm, etc.), design specifications 940, characterization data 950, verification data 960, design rules 970, and test data files 985 (which may include test patterns and other testing information).

Design process 910 may further include, for example, standard circuit design processes such as timing analysis, verification, design rule checking, place and route operations, etc. One of ordinary skill in the art of integrated circuit design can appreciate the extent of possible electronic design automation tools and applications used in design process 910 without deviating from the scope and spirit of the invention. The design structure of the invention is not limited to any specific design flow.

Design process 910 preferably translates an embodiment of the invention as shown in FIGS. 9, 12 and 15, along with any additional integrated circuit design or data (if applicable), into a second design structure 990. Design structure 990 resides on a storage medium in a data format used for the exchange of layout data of integrated circuits (e.g. information stored in a GDSII (GDS2), GL1, OASIS, or any other suitable format for storing such design structures). Design structure 990 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 9, 12 and 15. Design structure 990 may then proceed to a stage 995 where, for example, design structure 990: proceeds to tape-out, is released to manufacturing, is released to a mask house, is sent to another design house, is sent back to the customer, etc.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A method comprising:
   forming a dummy gate structure on a substrate;
   forming a trench in the dummy gate structure;
   filling a portion of the trench with a Ge material;
   filling a remaining portion of the trench with gate oxide and gate conductor material, wherein the gate oxide is formed on a dielectric layer and on and directly in contact with the Ge material, and the gate conductor is formed on the gate oxide over the dielectric layer; and
   planarizing the gate oxide and gate conductor to the dielectric layer such that the gate oxide and the gate conductor in the trench is coplanar with the upper surface of the dielectric layer.

2. The method of claim 1, wherein the forming the trench comprises removing a nitride cap layer, a poly material and oxide material of the dummy gate structure.

3. The method of claim 1, wherein the filling the remaining portion of the trench with gate material includes depositing a liner of high K dielectric on a strain material and a gate metal or metal alloy on the liner.

4. The method of claim 3, further comprising planarizing the gate metal or metal alloy to a surface coplanar with a dielectric material.

5. The method of claim 1, wherein the trench extends to a channel region of the dummy gate structure.

6. The method of claim 1, further comprising forming a lightly doped P− region of a NFET device under the dummy gate structure.

7. The method of claim 6, further comprising:
   forming N+ regions of the NFET device adjacent to the lightly doped P− region of the NFET device; and
   forming metal contact regions in the N+ regions of the NFET device and completely below an uppermost surface of the substrate.

8. The method of claim 1, further comprising forming a lightly doped N− region of a PFET device under the dummy gate structure.

9. The method of claim 8, further comprising:
   forming P+ regions of the PFET device adjacent to the lightly doped N− region of the PFET device; and
   forming metal contact regions in the P+ regions of the PFET device and completely below an uppermost surface of the substrate.

10. A method comprising:
    forming a dummy gate structure on a substrate;
    forming a trench in the dummy gate structure;
    filling a portion of the trench with a Ge material; and
    filling a remaining portion of the trench with gate oxide and gate conductor material,
    wherein the gate oxide material is formed on a dielectric layer and on and directly in contact with the Ge material, and
    wherein the forming the trench includes etching a recess into the substrate.

11. The method of claim 10, wherein the filling includes filling the recess with the Ge material.

12. The method of claim 10, wherein the forming the trench includes extending a recess into the substrate and under sidewalls of the dummy gate structure.

13. The method of claim 12, wherein the filling includes filling the recess under the sidewalls of the dummy gate structure with the Ge material.

14. A method of forming a device, comprising:
    building a dummy gate structure on a substrate;
    etching at least a portion of the dummy gate structure to a channel region which results in a formation of a trench between sidewalls of the dummy gate structure;
    depositing a Ge material on the substrate within the trench; and
    building a gate structure over the Ge material, wherein a gate oxide is formed on a dielectric layer and on and directly in contact with the Ge material, and a gate conductor is formed on the gate oxide over the dielectric layer; and
    planarizing the gate oxide and gate conductor to the dielectric layer such that the gate oxide and the gate conductor in the trench is coplanar with the upper surface of the dielectric layer.

15. The method of claim 14, wherein the building the gate structure includes depositing a dielectric material on the Ge material and a metal gate material on the dielectric material.

16. The method of claim 14, wherein the etching comprises removing a nitride cap layer, a poly material and oxide material of the dummy gate structure.

17. The method of claim 14, wherein the building a gate structure over the Ge material includes depositing a layer of high K dielectric on the Ge material and a metal or metal alloy on the high K layer.

18. The method of claim 14, further comprising forming a lightly doped P− region of a NFET device under the dummy gate structure.

19. The method of claim 18, further comprising:
forming N+ regions of the NFET device adjacent to the lightly doped P− region of the NFET device; and
forming metal contact regions in the N+ regions of the NFET device and completely below an uppermost surface of the substrate.

20. The method of claim 14, further comprising forming a lightly doped N− region of a PFET device under the dummy gate structure.

21. The method of claim 20, further comprising:
forming P+ regions of the PFET device adjacent to the lightly doped N− region of the PFET device; and
forming metal contact regions in the P+ regions of the PFET device and completely below an uppermost surface of the substrate.

22. A method of forming a device, comprising:
building a dummy gate structure on a substrate;
etching at least a portion of the dummy gate structure to a channel region which results in a formation of a trench between sidewalls of the dummy gate structure;
depositing a Ge material on the substrate within the trench; and
building a gate structure over the Ge material,
wherein a gate oxide is formed on a dielectric layer and on and directly in contact with the Ge material, and
wherein the etching includes etching a recess into the substrate.

23. The method of claim 22, wherein the depositing includes filling the recess in the substrate with the Ge material.

24. A method of forming a device, comprising:
building a dummy gate structure on a substrate;
etching at least a portion of the dummy gate structure to a channel region which results in a formation of a trench between sidewalls of the dummy gate structure;
depositing a Ge material on the substrate within the trench; and
building a gate structure over the Ge material,
wherein a gate oxide is formed on a dielectric layer and on and directly in contact with the Ge material, and
wherein the etching includes extending a recess into the substrate and under the sidewalls of the dummy gate structure.

25. The method of claim 24, wherein the depositing includes filling the recess under the sidewalls of the dummy gate structure with the Ge material.

* * * * *